United States Patent [19]

Yamaguchi et al.

[11] Patent Number: 5,047,949

[45] Date of Patent: Sep. 10, 1991

[54] STANDARD CELL LSI LAYOUT METHOD

[75] Inventors: Ryuichi Yamaguchi, Hirakata; Atsushi Yamamoto, Osaka, both of Japan

[73] Assignee: Matsushita Electric Industrial Co., Ltd., Osaka, Japan

[21] Appl. No.: 534,358

[22] Filed: Jun. 6, 1990

Related U.S. Application Data

[63] Continuation of Ser. No. 204,526, Jun. 9, 1988, abandoned.

[30] Foreign Application Priority Data

Jun. 10, 1987 [JP] Japan ................. 62-144650

[51] Int. Cl.$^5$ ............................................. G06F 15/60
[52] U.S. Cl. .................... 364/491; 364/490; 364/489; 364/488
[58] Field of Search .............. 364/488, 489, 490, 491

[56] References Cited

U.S. PATENT DOCUMENTS

| | | | |
|---|---|---|---|
| 4,613,941 | 9/1986 | Smith et al. | 364/490 |
| 4,636,965 | 1/1987 | Smith et al. | 364/491 |
| 4,686,629 | 8/1987 | Noto et al. | 364/488 |

OTHER PUBLICATIONS

"A Routing Program Applicable to Various Chip Structures of Gate Arrays" by Terai et al., Joho Shori Gakkai, Ronbunshi, vol. 25, No. 3, May 1984, pp. 357-364.

"An Over-Cell Gate Array Channel Router" by Krohn et al., IEEE 20th Design Automation Conference, 1983, pp. 665-670.

"Rectilinear Area Routing: A Channel Router Approach" by Hudson et al., IEEE, 1985, pp. 468-471.

"A Dense Gate Matrix Layout Method for MOS VLSI" by Lopez et al., IEEE Trans. Electron Devices, vol. ED-27, pp. 1671-1675, Aug. 1980.

*Primary Examiner*—Parshotam S. Lall
*Assistant Examiner*—V. N. Trans
*Attorney, Agent, or Firm*—Wenderoth, Lind & Ponack

[57] ABSTRACT

In a standard cell LSI including functional circuits formed by placing a group of cell rows consisting of standard cells selected from a group of standard cells and by routing the standard cells, a standard cell LSI layout method including the steps of comparing the routing density in routing areas located between the cell rows and bending the cell rows by shifting one or more of the standard cells in a direction of a more dispersed routing area from a more congested routing area. The cell rows are bent at a point between each high congested area of the routing area which encloses the cell rows depending on the routing density. A link cell may be provided for linking power and ground pins of the standard cells which have been shifted in position and which compose the bent cell rows. The link cell may be stored in a library in a system of composing the cell rows by storing the standard cells in a library and referring to the standard cells from the library in defining a standard cell LSI layout.

2 Claims, 5 Drawing Sheets

FIG. I

STANDARD CELL LSI LAYOUT METHOD

This application is a continuation of now abandoned application, Ser. No. 07/204,526 filed on June 9, 1988.

BACKGROUND OF THE INVENTION

This invention relates to a standard cell LSI layout method using standard cells.

As a technique of LSI layout, a layout by standard cell LSI is known, which is realized in the following procedure. (a) Standard cells having various logic functions (nand, nor, etc.) are stored in a library. (b) The gates described in a logic diagram are replaced by the standard cells stored in the library. (c) The replaced cells are arranged linearly in plural rows. (d) The standard cells are routed in accordance with the net list of gates in the logic diagram, using the area called a channel between rows as the routing area.

The standard cells to be used contain patterns of the power and ground wires therein. To supply power to the standard cells contained in the standard cell rows, it is necessary to place the standard cells linearly by combining the patterns of the power and ground wires of the standard cells contained in the same row. In order to combine the patterns of the power and ground wires, the position of a standard cell is limited within its cell row. Accordingly, if there is a deviation in the routing density (that is, the number of wires in the routing area) in the upper and lower channels adjacent to the cell row, a vacant area which is disadvantageous for reducing the chip area occurs. As a result, the LSI chip area is increased.

SUMMARY OF THE INVENTION

It is hence a primary object of this invention to reduce the LSI chip area, in a standard cell LSI layout, by decreasing the vacant area produced due to deviations of the routing density.

To achieve the above object, the LSI layout of this invention bends the cell rows by shifting the position of standard cells in proportion to the routing density of the upper and lower channels adjacent to the cell row, in a standard cell LSI.

While novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
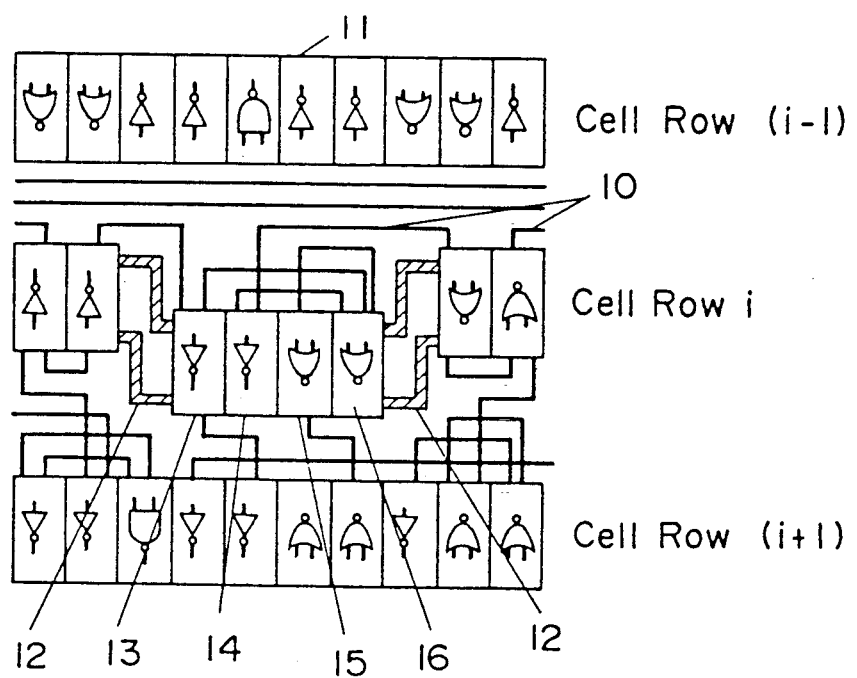
FIG. 1 is a layout drawing deflecting cell rows by shifting standard cells in a first embodiment of this invention.
Figure 2:
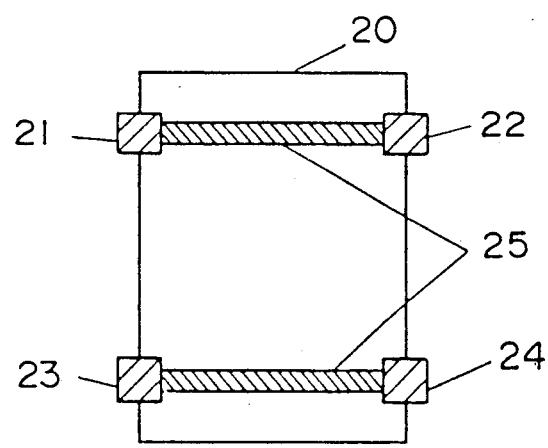
FIG. 2 is a structural drawing of power and ground wires in a standard cell.
Figure 3:
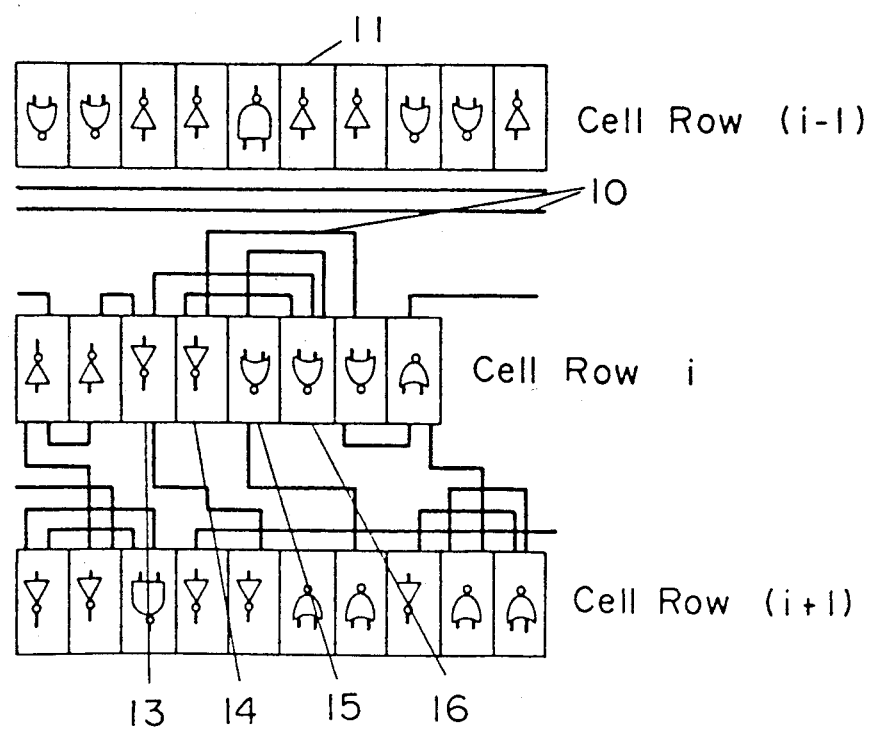
FIG. 3 is a layout drawing of placing standard cells by a conventional method.
Figure 4:
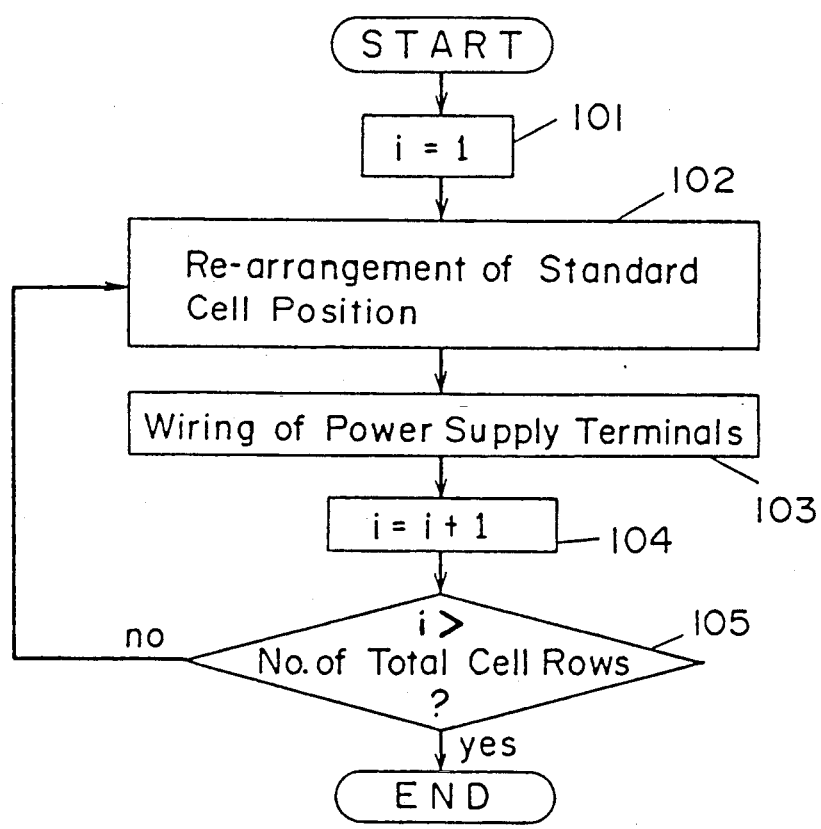
FIG. 4 is a flow chart of this invention.

Referring now to FIG. 1, FIG. 2, FIG. 3 and FIG. 4, a first embodiment of this invention is described below. FIG. 1 shows a layout drawing of the first embodiment of this invention, in which numeral 10 is a routing for connecting signal pins of standard cells; numeral 11 denotes standard cells; numeral 12 denotes is power and ground wires connecting the shifted standard cells, and numerals 13 to 16 denote shifted standard cells. FIG. 2 shows a pattern of power and ground wires in the standard cell. Numeral 20 shows a cell envelope of a standard cell; numerals 21 to 24 denote power and ground pins, and numeral 25 denotes is power and ground wires. FIG. 3 is a layout drawing before processing in accordance with this invention. In this drawing, numeral 10 denotes a signal wire connecting standard cells, and numerals 11, 13 to 16 denote standard cells. FIG. 4 is a flow chart showing a procedure for realizing the layout of the first embodiment.

The standard cell 11 shown in FIG. 1 and FIG. 3 contains power and ground wires 25 as shown in FIG. 2, and by placing the standard cells 11 as shown in FIG. 3 by matching the position of power and ground pins 21 to 24, the power and ground pins of the standard cells 11 are connected to each other. Next, by connecting the signal pin of the standard cell 11 according to the specified net list, the layout shown in FIG. 3 is obtained. In FIG. 3, by the net list of connecting signal pins of standard cells 11, a deviation occurs in the density of routing 10, and a vacant area of routing 10 is formed above and beneath part of the cell rows. Here, the following processing is done on the basis of the flow chart in FIG. 4.

(1) At the first step 101, i is set equal 1.

(2) The number of routings passing the upper and lower channels of each cell belonging to cell row i are counted.

(3) At the second step 102, in the portion of the upper and lower channels of each standard cell, if there is one or more standard cells having a particularly high density at one side and not so high a density in the other channel, such standard cells are shifted in the direction of the less dense channel.

(4) At the third step 103, shifted power and ground pins are routed.

(5) At the fourth step 104, i is set equal to i+1.

(6) At the fifth step 105, if i is greater than the number of cell rows, the processing is terminated. Otherwise, the process returns to the second step 102.

Here, cell row i in FIG. 3 is picked up as an example. The number of routings of the upper and lower channels of the standard cell belonging to cell row i in FIG. 3 are counted. In this case, the number of routings passing a part of upper channel of standard cells 13 to 16 is greater than the number of routings passing a part of the lower channel. In addition, a vacant area of routing is produced beneath the standard cells 13 to 16. In the standard cells on both sides of the standard cells 13 to 15, there is a vacant area of routing in the upper channel, while the routing is dense in the lower channel. In other words, between the upper and lower channel parts of standard cells 13 to 16, and the upper and lower channel parts of the standard cells at both sides of standard cells 13 to 16, the state of density of routing is reversed. Accordingly, the standard cells 13 to 16 are shifted downward as shown in FIG. 1. By this cell row bending action, the shape of the cell row i is matched with the density status of the routing 10, and the vacant area without routing 10 is decreased, so that the circuit layout area is reduced. However, as a result of cell row bending, the power and ground pins 21 to 24 of the standard cells shown in FIG. 2 are shifted, and the connection between the power and ground pins of the standard cells 13 to 16 and the power and ground pins of the other standard cells belonging to the cell row i is interrupted. By placing the power and ground wires 12, the shifted power and ground pins are connected. By repeating the same operation for all the cell rows, in the first embodiment, the vacant areas without routing can be decreased, so that the circuit layout area can be reduced.

Figure 5:
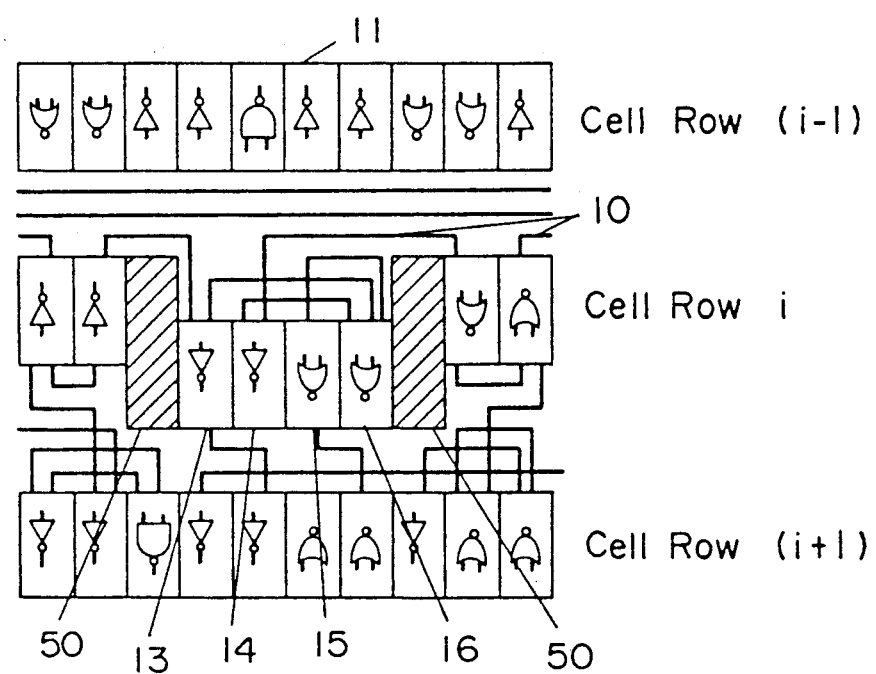
FIG. 5 is a layout drawing of deflecting cell rows by shifting standard cells in a second embodiment of this invention.
Figure 6:
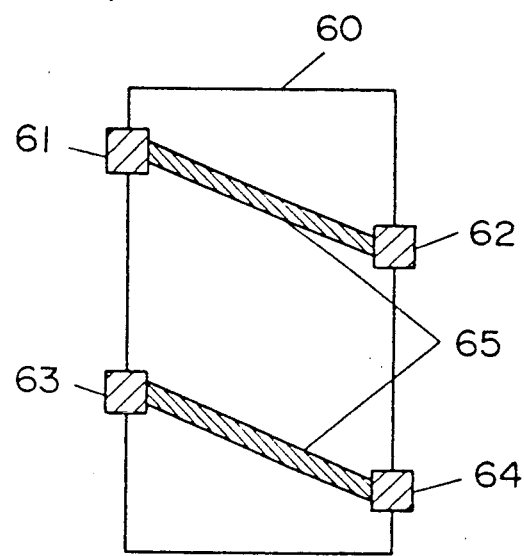
FIG. 6 and FIG. 7 are structural drawings of link cells.
Figure 7:
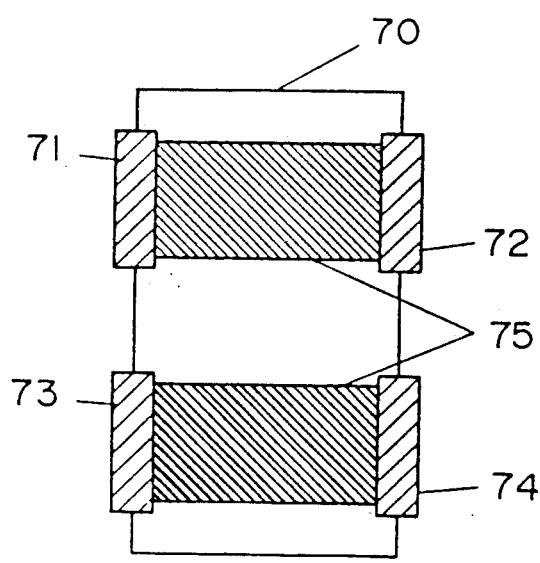

Next, a second embodiment of this invention is described while referring to FIG. 5, FIG. 6 and FIG. 7. FIG. 5 is a layout drawing of the second embodiment, in which numeral 10 is a routing for connecting signal pins of standard cells numeral 11 denotes standard cells, and numeral 50 denotes a link cell. FIG. 6 is a structural drawing of the link cell. Numeral 60 notes a cell envelope; numerals 61 to 64 denote power and ground pins, and numeral 65 denotes power and ground wires. FIG. 7 denotes, similarly to FIG. 6, a structural drawing of the link cell. In this drawing, numeral 70 is a cell envelope; numeral 71 to 74 denote power and ground pins, and numeral 75 denotes power and ground wires.

In the second embodiment, the power and ground pins of the standard cells 13 to 16 shifted as shown in FIG. 5 are linked by using link cell 50 shown in FIG. 6 or FIG. 7. This technique is described below. The link cell 50 shown in FIG. 6 or FIG. 7 is stored in the library of standard cells, and it can be placed in the same fashion as other standard cells. The link cell 50 shown in FIG. 7 has broader power and ground pins 71 to 74 as compared with the power and ground pins 20 to 24 shown in FIG. 2. First, as in the first embodiment, the number of routings 10 passing the upper and lower channels is counted in each cell row, and the standard cells 13 to 16 are shifted depending on the deviation of density of routing. As a result, the power and ground pins of the standard cells 13 to 16 are shifted from those of other standard cells. To connect the interrupted power and ground pins, the link cell 50 shown in FIG. 6 or FIG. 7 is inserted between the separated standard cells. At this time, when inserting the link cell 50 shown in FIG. 6, the position of the link cell 50 is determined so that the positions of the power and ground pins 61 to 64 may coincide with the power and ground pins 20 to 24 of the standard cells at both sides of the link cell 50. Thus, the interrupted power and ground pins are connected by the power and ground wire 65 of the link cell 50. Or, when the link cell 50 shown in FIG. 7 is used, by placing so that the width of the power and ground pins 20 to 24 may settle within the range of the width of power and ground pins 71 to 74, the power and ground terminals of the shifted standard cells 13 to 16 are connected with the power and ground pins of the standard cells at both sides. As a result, same as in the first embodiment, the vacant area without wiring 10 may be decreased, and the circuit layout area is reduced.

The most important point in the second embodiment is the use of link cell 50, instead of the power and ground wire 12 used in the first embodiment. That is, when using the power and ground wire 12, it is necessary to generate patterns every time the cell row is bent. On the other hand, when the link cell 50 is used, it is enough to place the link cell 50 stored in the library in the cell row same as other standard cells 11, so that it can be handled exactly the same as the standard cells. Therefore, in a computerized system, processing is simplified and the efficiency is enhanced by storing the link cell in the standard cell library, and handling it same as the standard cells.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. In a standard cell LSI comprising functional circuits formed by placing a plurality of cell rows consisting of a plurality of standard cells and by routing said standard cells, a standard cell LSI layout method comprising the steps of:

deciding a global routing path which connects signal pins of said standard cells; and determining the routing density from said global routing path in routing channels between cell rows; and bending said cell rows in a zigzag lien by shifting one or more of said standard cells in a direction of a more dispersed routing area from a more congested routing area in order to avoid congested routing area between said cell rows; and shifting at least one cell row in order to eliminate wiring area containing no wiring between said cell rows, which is produced as a result of bending of cell rows; and connecting said signal pins of said standard cells by generating routing patterns.

2. A standard cell LSI layout method according to claim 1, further comprising the step of providing at least one link cell for linking power and ground pins of said standard cells which have been shifted in position and which compose the cell rows which have been bent.

* * * * *